United States Patent [19]
Lee et al.

[11] Patent Number: 6,049,458
[45] Date of Patent: Apr. 11, 2000

[54] PROTECTIVE CAP FOR THERMAL GREASE OF HEAT SINK

[75] Inventors: Shun-Jung Lee, Pan-Chiao; Hsieh-Kun Lee, Jung-Ho, both of Taiwan

[73] Assignee: Hon Hai Precision Ind. Co., Ltd., Taipei Hsien, Taiwan

[21] Appl. No.: 09/203,904

[22] Filed: Dec. 1, 1998

[30] Foreign Application Priority Data

Dec. 1, 1997 [TW] Taiwan .................................. 86220094

[51] Int. Cl.⁷ ........................................................ H05K 7/20
[52] U.S. Cl. .......................... 361/705; 361/704; 361/708; 165/185; 257/707; 422/258; 427/259; 427/282
[58] Field of Search ...................................... 361/704, 705, 361/706, 708; 165/185; 422/258; 427/259, 282; 428/266; 106/162.51, 164.01, 172.1, 206.1, 217.01, 287.35, 400; 536/102; 257/706–727; 174/16.3, 52.4

[56] References Cited

U.S. PATENT DOCUMENTS 5,897,917 4/1999 Hinshaw et al. ..................... 422/258

FOREIGN PATENT DOCUMENTS 411168161 6/1999 Japan ............................. H01L 23/40

*Primary Examiner*—Leo P. Picard
*Assistant Examiner*—Michael Datskovsky

[57] ABSTRACT

A heat sink for dissipating heat generated by a CPU, includes a metallic base, a number of heat dissipating fins projecting from the base, thermal grease spread on the base, and a protective cap enclosing the thermal grease to protect it from being contaminated before the heat sink is assembled to the CPU or a CPU module.

11 Claims, 4 Drawing Sheets

PROTECTIVE CAP FOR THERMAL GREASE OF HEAT SINK

BACKGROUND OF THE INVENTION

1. Field of The Invention

The present invention relates to a heat sink, and particularly to a heat sink having a removable protective cap for enclosing thermal grease on the heat sink, thereby protecting the thermal grease from contamination before the heat sink is assembled to a CPU/CPU module.

2. The Prior Art

Following the increase in consumed power of CPUs, heat sinks made by aluminum extrusion or folded fins are popularly used to dissipate heat generated by the CPUs. The heat sinks disclosed in U.S. Pat. Nos. 5,019,940, 5,276,585, 5,486,981, 5,590,025 and 5,594,624 directly contact a CPU.

Referring to FIG. 1, a CPU and other auxiliary components (not shown) are received in a CPU module 1 which has a metallic mounting plate 12 contacting the CPU and defines a number of holes 122 for extension of a mounting device (not shown) therethrough to fixedly attach a heat sink 3 to the CPU module 1. To improve heat conductivity between the heat sink 3 and the mounting plate 12, thermal interface material 2 is applied to a bottom face 310 of the heat sink 3. The heat from the CPU causes the thermal interface material 2 to become viscous thereby filling the air gap between the heat sink 3 and the mounting plate 12. The thermal interface material 2 can be thermal tape or thermal grease. A strip of thermal tape applied to the bottom face 310 of the heat sink 3 in advance will not contaminate surrounding articles or be contaminated by dust or foreign particles during transportation/handling of the heat sink 3 since it is solid at ambient temperature. Thermal grease cannot be applied to the heat sink 3 in advance since it is not solid at ambient temperature and may contaminate surrounding articles or be contaminated by dust or foreign particles before the heat sink 3 is assembled to the CPU module 1. Conventionally, the thermal grease is applied to the heat sink 1 just prior to assembly with the CPU module 1. Such an operation extends the assembly time of the heat sink 3 and the CPU module 1.

Although thermal tape is more convenient to use, it has a higher viscosity when heated; therefore, it can not improve the heat conductivity of the heat sink as well as thermal grease. Hence, an improvement is needed so that the thermal grease can be applied to the heat sink in advance without contaminating surrounding articles or being contaminated by dust or foreign particles during transportation or handling of the heat sink.

SUMMARY OF THE INVENTION

Accordingly, an objective of the present invention is to provide a heat sink having thermal grease applied on a bottom face thereof which will not contaminate surrounding articles or be contaminated by dust or foreign particles before the heat sink is assembled to a CPU/CPU module.

To fulfill the above mentioned objective, according to one embodiment of the present invention, a heat sink consists of a flat base, a number of heat dissipating fins projecting from the base away from a bottom face thereof, thermal grease applied to the bottom face of the base by a printing process, and a rectangular protective cap having a flat flange removably attached to the bottom face surrounding the thermal grease and a middle protrusion enclosing the thermal grease. During transportation or handling of the heat sink, the thermal grease will not contaminate surrounding articles or be contaminated by dust or foreign particles.

DETAILED DESCRIPTION OF THE PREFERRED EMBODIMENTS

Reference will now be made in detail to the preferred embodiments of the present invention.

Figure 1:
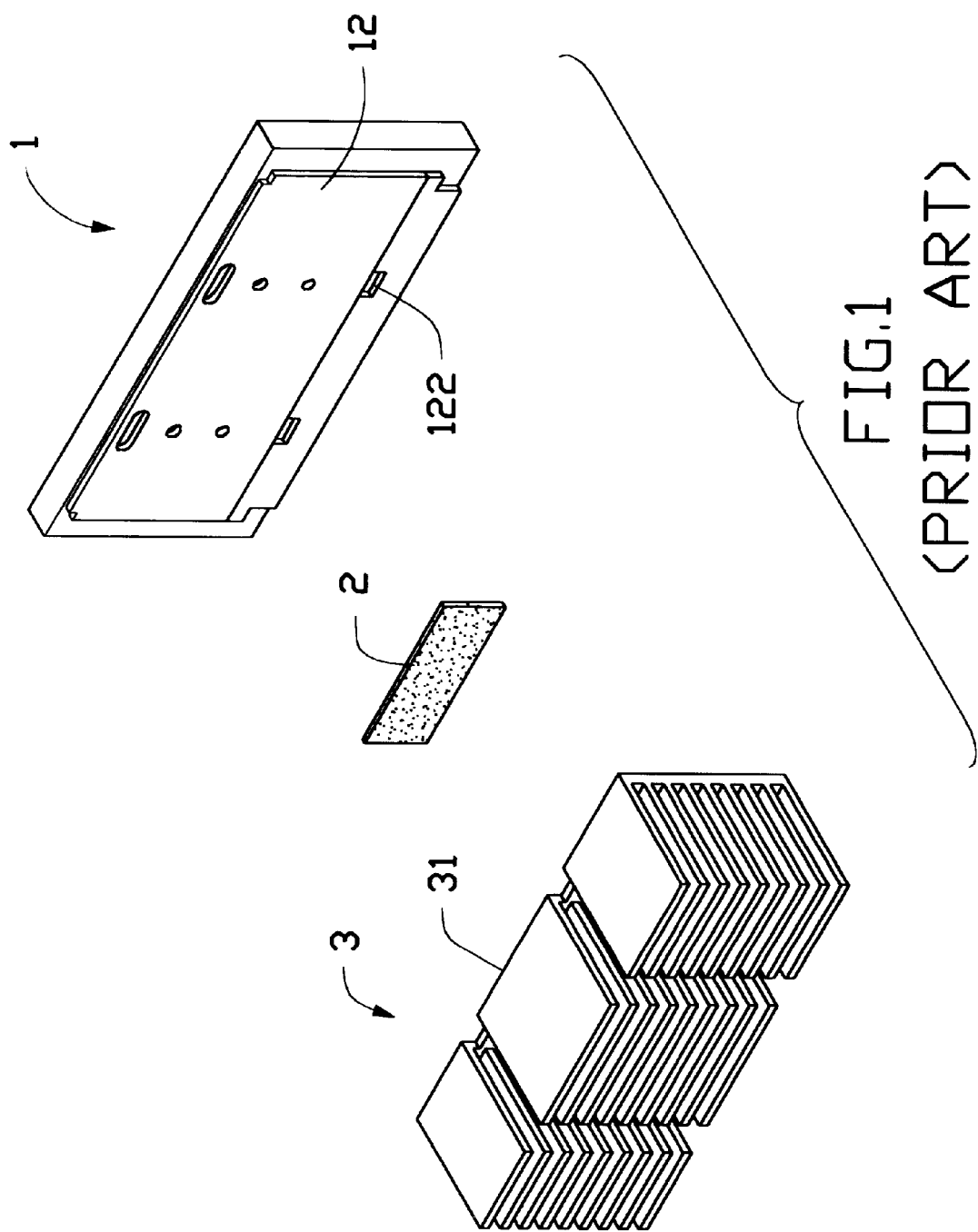
FIG. 1 is an exploded, perspective view of a combination of prior art heat sink, a CPU module and thermal interface material.
Figure 2:
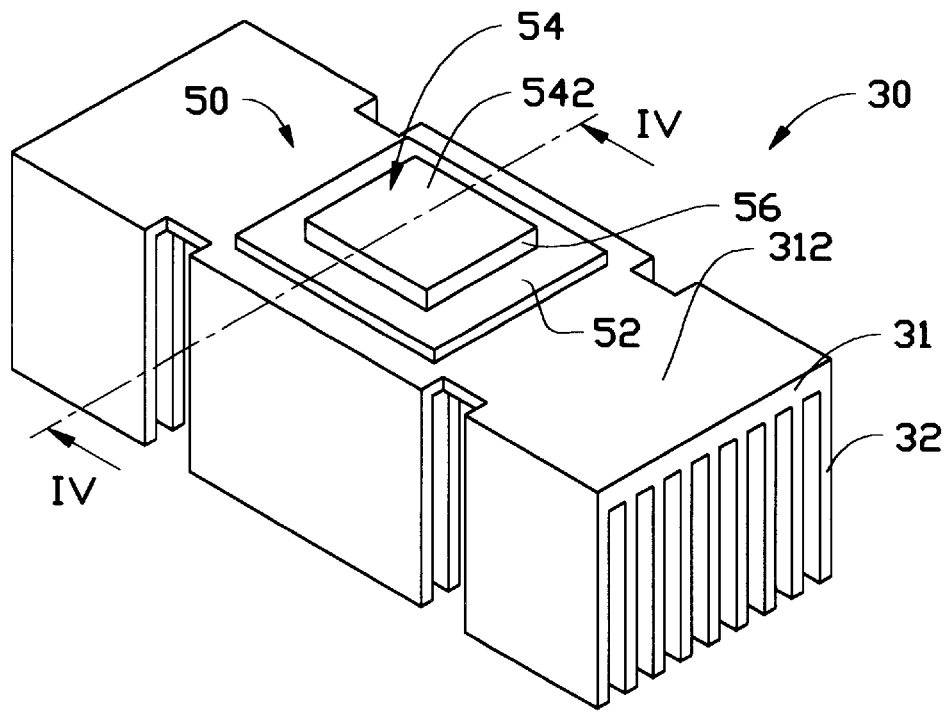
FIG. 2 is a perspective view of a heat sink in accordance with a first embodiment of the present invention.
Figure 4:
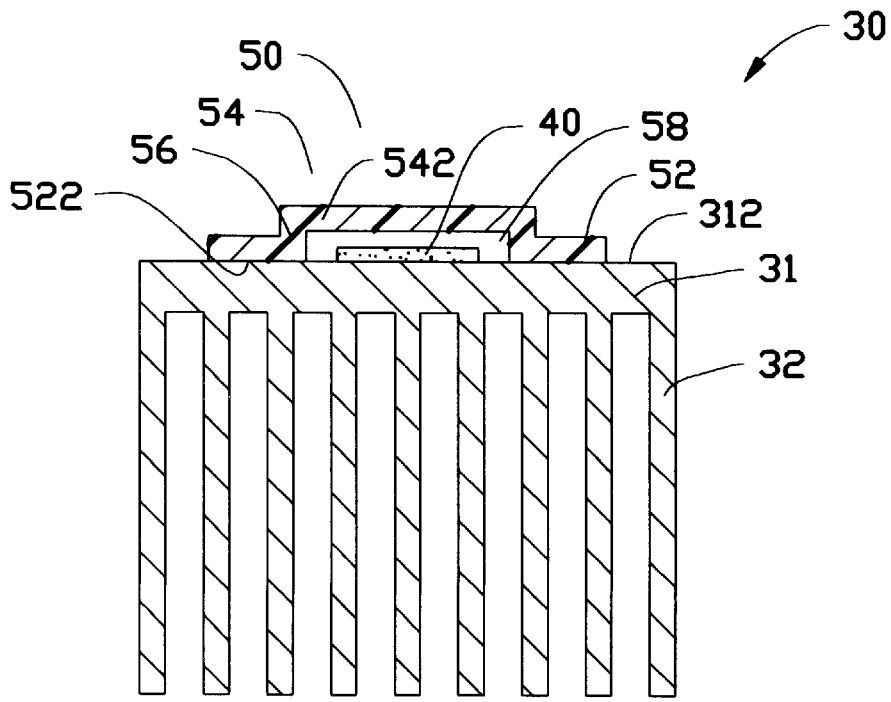
FIG. 4 is a cross-sectional view taken along line IV—IV of FIG. 2.
Figure 3:
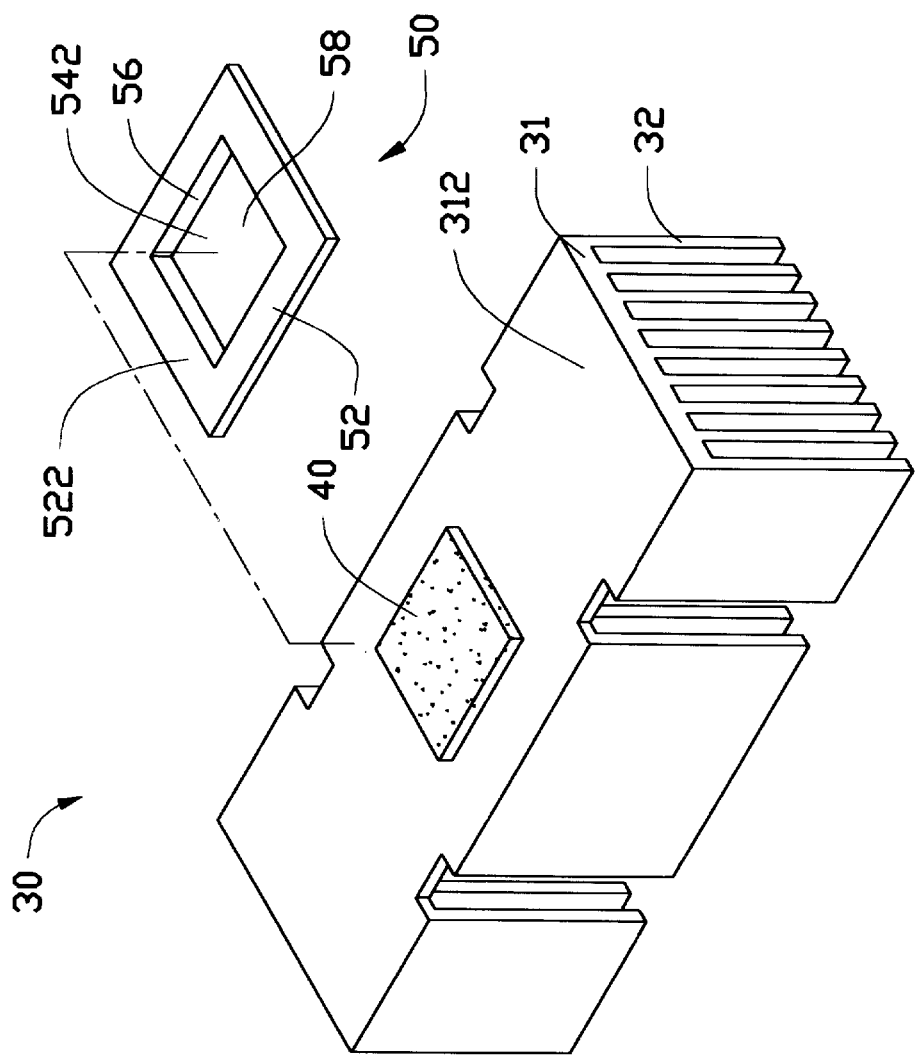
FIG. 3 is a view similar to FIG. 2 with a protective cap removed therefrom.

Referring to FIGS. 2–4, a heat sink 30 in accordance with a first embodiment of the present invention includes a metallic base plate 31 and a number of metallic heat dissipating fins 32 integrally projecting from the base plate 31 away from a bottom face 312 of the base plate 31. The bottom face 312 contacts a CPU (not shown) directly or a mounting plate of a CPU module (not shown) which then contacts a CPU.

Thermal grease 40 is uniformly spread on a middle portion of the bottom face 312 by a printing process (preferably, a screen printing process) and has a rectangular shape. A protective cap 50 is removably attached to the bottom face 312 to enclose the thermal grease 40 so that during transportation or handling of the heat sink 30, the grease 40 will not contaminate surrounding articles or be contaminated by dust or foreign particles.

The protective cap 50 is made by pressing a plastic sheet to have a rectangular configuration with a flat flange 52 along a periphery thereof, and a middle protrusion 54 having a side wall 56 connecting with the flange 52 and a top cover 542 connecting with the side wall 56. A cavity 58 is defined in the middle protrusion 54 below the cover 542. A bottom face 522 of the flange 52 is applied with adhesive whereby the cap 50 is removably attached to the bottom face 312 of the heat sink 30 at a position where the flange 52 surrounds the thermal grease 40 so that the thermal grease 40 is received in the cavity 58 and enclosed by the cover 542 and side wall 56 of the protrusion 54. Thus, the grease 40 is protected from contamination by dust or foreign particles, and will not contaminate surrounding articles during transportation or handling of the heat sink 30.

Prior to assembling the heat sink 30 to a CPU or a CPU module, the protective cap 50 is peeled away to expose the thermal grease 40. The heat sink 30 and the CPU/CPU module are then assembled together by a known procedure. By the provision of the protective cap 50, the thermal grease 40 can be applied to the heat sink 30 in advance, thereby simplifying the assembly process of the heat sink 30 and the CPU/CPU module.

Figure 5:
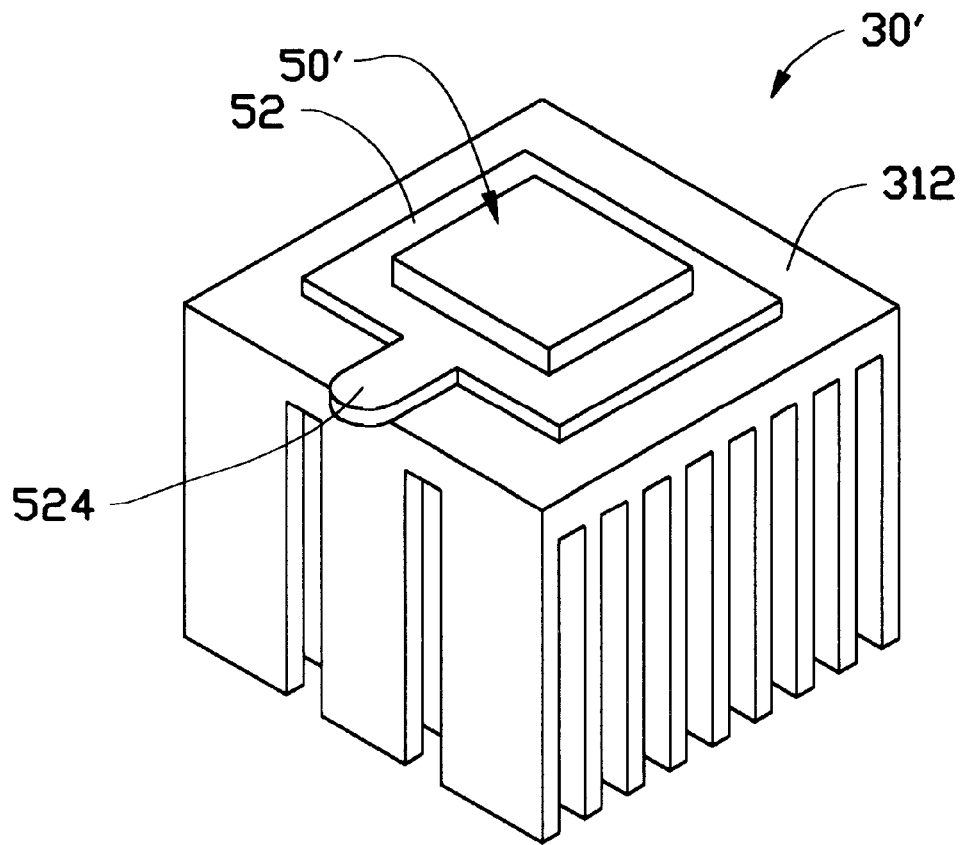
FIG. 5 is a perspective view showing a heat sink in accordance with a second embodiment of the present invention.

To facilitate the removal of the protective cap from the heat sink when the heat sink is to be assembled to the CPU/CPU module, a heat sink 30' in accordance with a second embodiment of the present invention is shown in FIG. 5. The heat sink 30' has a protective cap 50' provided with an ear 524 integrally formed with the flange 52 and extending beyond an edge of the bottom face 312 of the heat sink 30'. Thus, a user can conveniently grip the ear 524 to peel the protective cap 50' away from the heat sink 30'.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A heat sink for dissipating heat generated by a CPU, comprising:

a metallic flat base having a bottom face for contacting the CPU;

a number of metallic fins projecting from the base away from the bottom face;

thermal grease spread on the bottom face;

a protective cap having a periphery removably attached to the bottom face of the heat sink around the thermal grease, and a middle protrusion defining a cavity receiving the thermal grease therein, said protrusion enclosing the thermal grease whereby the thermal grease will not be contaminated by dust or foreign particles and will not contaminate surrounding articles when the heat sink is transported or handled.

2. The heat sink in accordance with claim 1, wherein the thermal grease is uniformly spread on the bottom face of the heat sink by a printing process.

3. The heat sink in accordance with claim 2, wherein the thermal grease is spread on the bottom face of the heat sink by a screen printing process.

4. The heat sink in accordance with claim 1, wherein both the thermal grease and the protective cap have a rectangular shape.

5. The heat sink in accordance with claim 4, wherein the protrusion of the cap has a side wall connecting with the flange, and a cover connecting with the side wall.

6. The heat sink in accordance with claim 1, wherein the protective cap has an ear integrally formed with the flange and extending beyond an edge of the bottom face of the base of the heat sink.

7. The heat sink in accordance with claim 4, wherein the protective cap has an ear integrally formed with the flange and extending beyond an edge of the bottom face of the base of the heat sink.

8. The heat sink in accordance with claim 1, wherein the flange is attached to the bottom face of the base by an adhesive.

9. The heat sink in accordance with claim 1, wherein the protective cap is made by pressing a plastic sheet.

10. A heat sink for dissipating heat generated by a CPU, comprising:

a base having a bottom face for contacting with the CPU;

thermal grease applied on the bottom face; and a protective cap attachably positioned on the bottom face and enclosing the thermal grease thereby protecting the thermal grease from contamination.

11. A protective cap for use with a heat sink, comprising a flange and a cover connected by a side wall to commonly define a rectangular shape thereof, and an ear integrally formed with the flange wherein said side wall and the cover commonly define a protrusion and a corresponding cavity therein to protectively cover thermal grease applied to a base of said heat sink.

* * * * *